United States Patent Office 3,181,936 Patented May 4, 1965

3,181,936

SUPERCONDUCTORS AND METHOD FOR THE PREPARATION THEREOF

John P. Denny, Shillington, Pa., and Richard W. Hardt, Scotia, N.Y., assignors to General Electric Company, a corporation of New York No Drawing. Filed Dec. 30, 1960, Ser. No. 79,513
4 Claims. (Cl. 29—194)

This invention pertains generally to the modification of superconductive compositions. More particularly, this invention relates to the chemical combination of superconductive compositions with other elements to yield products having improved electrical, magnetic, and physical properties. Specifically, the invention relates to the preparation of improved superconductors in situ.

The term "superconductor" as used hereinafter in the specification and claims designates a solid metal body having superconductivity characteristics and which is partly or completely finished into a usable electrically conducting member, such as a slab, strip, or wire.

When some elements and some metallic alloys are cooled to temperatures close to absolute zero, their electrical resistances drop suddenly to zero. This phenomenon is known as superconductivity; that is, when these materials have zero resistance, they are said to be superconductive. Twenty-two elements are superconductive as well as many metallic alloys, some of which are not formed from these twenty-two elements. All of the twenty-two elements become superconductive at temperatures below approximately 11.2° K., the particular critical temperature depending on the particular element. The highest critical temperature for a known superconductive alloy is about 18° K.

These superconductive materials possess other interesting characteristics when in the superconductive state, besides zero resistance. They exclude magnetic fields of magnitudes below a value called the critical field. The critical field depends upon the particular superconductive material as well as its temperature. When a field of magnitude greater than the critical field is applied to a superconductive material, the material reverts to its normal resistance even though it is maintained below the critical temperature. Superconductivity can also be destroyed by passing a current through the superconductive material greater in magnitude than the critical current, which is the value of current at which the material reverts to its normal resistance. This phenomenon can be partially explained by a consideration of the magnetic field produced by this current which, of course, when it reaches the magnitude of the critical field, causes the superconductive material to revert to its normal state.

It would be desirable for many reasons to increase the critical field as well as the critical temperature at which a particular material is superconductive. For example, certain electronic devices employ the phenomenon of superconductivity to produce useful results. A switching device employing this phenomenon may be constructed by surrounding a superconductor with a coil formed of an electrically conducting material, refrigerating means being provided to maintain the superconductor below the critical temperature. A current is passed through the coil and when this current is raised to a value sufficient to produce a critical magnetic field within the coil, the superconductor returns to a resistive or normal state. Therefore, a switching action may be secured by passing a controlling current through the aforementioned coil to switch a current in the superconductor. In the mentioned device, as well as in any device employing the phenomenon of superconductivity, it would be advantageous to reduce the size of the refrigeration system required to maintain the superconductor in a state of superconductivity. Specifically, if the super conductor retains the desirable conductivity and/or magnetic properties at a more elevated temperature, it is possible to reduce the size of the refrigeration system for a given size element. A less obvious advantage resulting from the utilization of higher operating temperatures for the superconductive element is the ability to use gaseous helium as the refrigerant instead of the generally employed liquid helium. In greater explanation, where it is possible to operate the superconductive element at temperatures above the boiling point of helium, a satisfactory refrigeration system could simply pass a stream of cold gaseous helium over the superconductive element and thereby cool the element to a temperature approximating that of the refrigerant gas straem. Such systems are known in the refrigeration art and are termed "open" refrigeration systems. In contrast thereto, a more complex refrigeration system is generally required to maintain a superconductive element in heat transfer relationship with liquid helium.

Other advantages result from an increase in the critical field for a particular superconductive material. Elevation of the critical field value allows greater external electrical fields to surround the superconductor before resistance will be restored in the element. Hence, a modified superconductor remains superconductive in association with higher ambient field strengths than an unmodified superconductor under the same conditions. The importance of this characteristic can be demonstrated by the knowledge that if superconductors carrying certain levels of current are restored to the resistive state, they will be overheated to the point of fusion. Under these conditions, fusion of the superconductor can occurs even while the member is immersed in liquid helium. A superconductive material which possesses a higher critical field value will also have a higher critical current value so that a superconductor made therefrom can carry more current before becoming resistive. An advantage from all of this is that a superconductor composed of a modified superconductive composition according to the practice of the invention will remain superconductive when subjected to higher currents as well as high external fields than is possible for a superconductor composed of the unmodified composition.

Still other advantages are gained from the modification of the composition for a particular superconductive material which allows use of higher magnetic fields, electrical currents, and temperatures in association with the superconductor made therefrom. Only eight of the twenty-two superconductive elements are superconductive above the boiling point of liquid helium (4.2° K.). It would be advantageous to elevate the operating temperatures above the boiling point of helium for superconductors composed of the remaining fourteen superconductive elements and realize the advantages of using a gaseous helium or liquid hydrogen refrigerant system in the particular device employing the superconductor. Additionally, superconductive elements having a critical temperature above the boiling point of helium, such as niobium and vanadium, are expensive materials. It would be advantageous therefore, to substitute less expensive superconductive elements such as aluminum and tin for at least portions of the niobium and vanadium if equivalent properties could be obtained. Further advantages can be obtained by utilizing a greater number of the superconductive elements. For example, selection of a particular superconductive material in a given application often depends upon properties other than superconductivity such as mechanical strength and ease of fabrication. It will be advantageous, therefore, to provide a method for generally improving the superconductivity characteristics for all of the twenty-two elements in order to obtain the best possible balance of properties in an application for a superconductor.

It is the object of the invention, therefore, to provide a novel method for improving a superconductor.

It is another object of the invention to provide novel superconductors having a high critical temperature, a high critical current, and a high critical field.

It is another object to provide a superconductor which comprises a particular combination of a superconductor and another element to provide a composition in situ having improved superconductivity characteristics.

It is still another object to provide a superconductor having incorporated therein a reaction product of the superconductor with another element having improved superconductivity characteristics.

The method of the invention comprises reacting a superconductor with a dissimilar element at elevated temperatures to yield a crystalline reaction product generally having a $\beta$-tungsten structure. Preferred products are formed in situ in a superconductor which may be in partly or completely finished form, such as a wire or strip. With this method, it is possible to convert the entire composition of the original superconductor to the reaction product having improved superconductivity characteristics. On the other hand, it may be desirable to modify only a surface layer of the original superconductor to take advantage of better mechanical, thermal, or other characteristics in the original composition of the interior layer. The present method provides superconductors which are difficult or unfeasible to obtain by any other means. While not fully understanding the exact mechanism by which the reaction products are formed, and, therefore, not desiring to limit the invention to any particular theoretical considerations, a typical reaction for the improvement of a superconductor proceeds primarily by diffusion of the element into the superconductor and reaction of the diffused element with the superconductor metal therein to form the improved product. An indication that the reaction products are not formed primarily on the surface of the superconductor, as will be further amplified hereinafter in the examples, is the relatively unchanged dimensions and appearance of the improved superconductor.

The present diffusion initiated reaction resulting in an improved superconductor can be distinguished in certain important respects from the usual processes for depositing metal coatings on a metal base wherein some diffusion between the metals is said to occur. For example, it is not necessary for improved results that the superconductors have an exterior surface layer of the diffusing element itself as occurs in the known processes. This is not to say that improved results will not be obtained for a superconductor having such a coating provided that the coating has superconductivity characteristics. The importance of the distinction is that the superconductors can be reacted with elements which are not superconductive, but which yield an improved superconductor. While it is not believed disadvantageous for the superconductor to have a superconductive coating, a non-superconductive coating produces undesirable effects. For example, a non-superconductive coating would absorb at least a portion of the magnetic flux field employed as the means to "switch" the circuit in the cryogenic electronic device heretofore described, thereby interfering with the normal operation of the device. It should also be pointed out that a modified superconductor having a surface coating of the metallic element has improved performance characteristics comparable to the modified superconductor without the coating only in association with D.C. fields.

The present method can also be distinguished from the prior art processes in other important considerations. The prior art processes for depositing a metal coating on a base metal wherein some diffusion between the metals is said to occur require diffusion of the coating element sufficient only to assure adequate bonding of the coating to the base. Excess diffusion of the coating element reduces the coating efficiency since additional element is required for a given thickness coating. In contrast thereto, it is necessary for the successful practice of the invention that sufficient element diffuse into the base metal and react therewith to form a continuous layer of a material having a different chemical structure and improved superconductivity characteristics compared to either the base layer or the diffusing element. Additionally, the prior art processes obtain a diffusion layer of intermetallics which are known to duplicate the phase diagram for the particular metals employed. While there may be mixtures of the diffusing element with the base metal in the diffusion layer of the present improved superconductors, the composition of the diffusion layer comprises primarily a single crystalline phase having a different structure than the reactant metals. For the purposes of describing the invention herein, the terms "metal" and "metallic," wherever appearing will be understood to include elements and even alloys not generally considered within the classic definition of a metal, namely, a substance which replaces the hydrogen of an acid and forms bases with the hydroxyl radical. The terms are used herein a broader sense and designate electropositive elements or combinations thereof which react according to the invention to form the characteristic $\beta$-tungsten crystalline structure.

The general nature of the invention having been set forth, the following examples are presented to illustrate but not to limit the preferred means for carrying out the invention.

*Example 1*

An improved superconductor is prepared from a 0.010 inch diameter niobium wire by diffusing vaporized elemental tin into the niobium metal at elevated temperatures. Accordingly, into the reaction chamber of a radiant heated furnace, equipped with a source of vacuum, there is placed both a supply of powdered tin and the niobium wire to be treated. The reaction chamber is first evacuated to approximately $10^{-6}$ mm. of mercury vacuum, then heated to approximately 1200° C., whereupon substantial portions of the tin are volatilized so as to essentially envelope the heated niobium wire in tin vapor. The elevated temperature and vacuum are maintained for a period of approximately 48 hours, during which period a substantial amount of tin vapor diffuses into and reacts with the niobium base metal, although there is no visible tin coating on the wire and the wire diameter remains substantially unchanged. Heating is discontinued at the end of the reaction period and the treated wire is cooled under vacuum at the ordinary rate for self-cooling of the furnace.

A cross-sectional photomicrograph of the treated wire discloses a thin layer of the reaction product of tin with the niobium base metal extending inwardly from the circumference of the wire and being of approximately 0.001 inch thickness. An X-ray diffraction analysis of the reaction product reveals the composition to be nominally $Nb_3Sn$. Other tests indicate that the wire is superconducting at approximately 17.8° K. as compared to a critical temperature of approximately 8° K. for untreated niobium wire. Additionally, the treated wire remains superconductive at 15° K. while carrying 80 amperes pulse current.

While the critical field was not measured directly for the above treated sample, an indication of its value can be calculated from the following known relationship, $$H=\frac{0.4I}{d}$$

where $H$=magnetic field at a particular temperature (oersteds)
$I$=pulse current (amps)
$d$=diameter of superconductor (cm.)

by substituting in the equation the experimental conductivity measurements reported above. Thus, the treated niobium wire has a critical field of greater than 1260 oersteds at 15° K. In an actual susceptibility measurement for a niobium disc treated in the same manner as described in the example, the critical field at 4.2° K. for the sample was found to exceed 12,000 oersteds as compared to a value of about 2,500 oersteds for commercial untreated niobium.

*Example 2*

To illustrate the improvement in superconductivity characteristics for a niobium superconductor modified with another superconductive element, a sample of niobium wire is treated with aluminum according to the method of Example 1. Powdered aluminum and a sample of 0.030 inch diameter niobium wire are heated according to the method of the said example except that the reactants are heated to approximately 1350° C. for 48 hr. after evacuation to about $10^{-6}$ mm. of mercury vacuum. The critical field strength for the modified niobium wire is about 12,000 oersteds at 4.2° K. compared to a value of about 2500 oersteds at 4.2° K. for the niobium. The composition of the surface layer comprises the crystalline reaction product of aluminum with niobium having a β-tungsten structure which is believed to be nominally $Nb_3Al$.

*Example 3*

Thus far, the improved products of the invention are prepared by reacting a metallic element which is itself superconductive with the base metal. Like products can be prepared, however, by the reaction of non-superconductive metallic elements with the base metal at elevated temperatures to form reaction products having the characteristic β-tungsten crystalline structure. More specifically, a thin flat strip of vanadium is heated to approximately 1500° C. in contact with silicon vapor according to the method of the preceding examples. Heating is maintained for a period of approximately 40 hr. to assure adequate diffusion and reaction of the silicon vapor and the treated vanadium is thereafter cooled in the usual manner. The treated strip comprises an interior layer of unmodified vanadium surrounded by a crystalline surface layer having the β-tungsten structure and which is believed to be nominally $SiV_3$. The appearance and dimensions of the treated strip are not altered significantly during the treatment process. The critical temperature for the treated superconductor modified in this manner is approximately 17.1° K. as compared to a critical temperature of approximately 5.1° K. for untreated vanadium metal.

*Example 4*

It is not intended to limit the method for modifying the composition of a superconductor to the vapor state reaction of a metallic element with the superconductor. For example, an improved product is obtained by contacting a niobium wire in a neutral or vacuum atmosphere with molten tin for a period sufficient to effect the desired diffusion and reaction of tin with the niobium wire.

Accordingly, a short length of 0.010 inch diameter niobium wire is immersed in a fused tin bath under neutral atmospheric conditions wherein a slow stream of argon is passed over the bath. Heat is supplied to maintain the bath at approximately 400° C. by means of an electrical heater surrounding the container for the tin. The wire is dipped into the fused tin a few times for contact periods ranging from 1 to 10 minutes to achieve a total build in excess of 1 mil. The coated wire is thereafter heated slowly to 1200° C. in an argon atmosphere to complete the diffusion reaction and finally cooled in the usual manner. Results of the treatment are substantially comparable to the results obtained by the method of Example 1 except that the treated wire still has a very thin surface coating which visibly resembles tin.

It is possible by modification of the above described process to obtain greater penetration of the diffusing element into the substrate of the superconductor than can be obtained by the vapor phase diffusion process of Examples 1 through 3. More particularly, if the quantity of the fused element in contact with the surface of the solid superconductor is maintained in relatively dilute amounts, then greater penetration of the superconductor substrate by the available fused element is promoted. Specifically, a fused tin bath which comprises about 10% or less tin by weight of the bath dissolved in an inert element which does not react with either the tin or superconductor, yields surface layers of the present reaction products in a niobium superconductor of greater thickness than for the above mentioned processes. Satisfactory inert diluents to form the fused tin bath for modification of a niobium superconductor include copper and silver.

The preferred products of the invention are modified superconductors having incorporated therein a reaction product of the base metal with a different metallic element, the products being generally characterized by improved superconductive properties. Other preferred products having improved superconductivity characteristics can be obtained having a coating of the metallic element overlying the modified superconductor. The preferred products may be more specifically described as the combination of a superconductor and a reaction product of the superconductor with a different element which comprises a base layer of a superconductive metal and a surface layer of the reaction product. Since it has been shown in the preceding examples that a superconductor, such as a wire, can be treated to improve its superconductivity properties without substantially altering the physical dimensions of the treated member, it will be obvious that the present products can also be defined by further specific characteristics of the particular modified superconductor. For example, the treated superconductive wires prepared in the above examples are stable compound-type superconductors having smooth continuous exterior surfaces. Additionally, the preferred products have not delaminated at elevated temperatures indicating excellent adherence between the surface layer and the base material. Especially preferred products of the invention are tin-modified niobium superconductors of the type illustrated in Example 1 by reason of the excellent properties thereof compared to other modified superconductors generally.

The elements which can be combined with a superconductor to form the present products can best be described as metallic elements having a different number of valence electrons than the base metal and which generally react with the base metal to form a crystalline compound having a β-tungsten structure. It is not required that the diffusing metal be itself superconductive in the solid state since certain non-superconductive metallic elements form the improved crystalline structure with the base metal. While the exact nature of the reaction which forms the preferred products is not clear at this time, it appears that the superconductivity of the base metal will be improved if the β-tungsten structure compound formed has a valence electron average between 4.5 and 4.75 per atom. It will thus be seen that the composition of the metallic element selected to obtain the desired reaction product with the base metal will be determined in part by composition of the base metal. Since superconducting elements for the base metal can be selected from the IIB, IIIA, IIIB, IVA, IVB, VB, VIIB, VIII groups of the periodic table, the class of metallic elements which can be reacted with a particular base metal composition to form the β-tungsten crystalline structure is understandably a broad one. Additionally, more than one element may be reacted with the base metal to improve the superconductivity as illustrated by the reaction of either tin, gallium, and aluminium with a niobium base metal to form the desired products according to the invention. Satisfactory metallic elements having the above characteristics can be selected from the class of substances having an average of between two and eight valence electrons per atom.

Other required characteristics for the metallic element will depend upon the particular method employed for the formation of the reaction product. More particularly, it is required that the metallic element have a lower melting point than the base metal if the reaction proceeds by contacting the base metal with either a vapor or a melt of the metallic element. On the other hand, the diffusion reaction also can be conducted by decomposing certain volatile compounds of the metallic element in contact with the superconductor and if this method is employed, it is not necessary that the metallic element have a lower melting point than the base metal. Satisfactory decomposable compounds of the metallic element which can be used in this method include carbonyls and halides of the element.

Th most preferred method for conducting the diffusion reaction comprises contacting a solid superconductor with the vapor of a lower melting-point metallic element in a manner such as described in Examples 1 through 3. A proper control of this method prevents the formation of any exterior coating on the treated superconductor comprising a continuous film of the metallic element. Thus, for the reaction conditions described in the said examples, it was shown possible to improve the superconductive properties of niobium superconductors in finished or final shape without substantially altering the physical dimensions or appearance of the member. In addition, no by-products are formed with the preferred method as occur in the method which decomposes a volatile compound of the metallic element. Such by-products often produce undesirable properties in the treated superconductor by combination therewith.

From the foregoing description, it will be apparent that a method for improving the superconductivity characteristics of a superconductor has been provided. While particular embodiments of the invention have been shown, it will, of course, be understood that the invention is not limited thereto and that many modifications of the general method may be made. It is within the scope of the invention, for example, to prepare superconductors according to the general method heretofore described by modifying the composition of a solid metal body composed of a metal which is not superconductive before modification. More particularly, certain metals such as molybdenum can be treated by the method of the invention with a metallic element that is superconductive in the solid state to form superconductors in situ having better superconductivity characteristics than the metallic element. Thus, the treatment of a molybdenum wire with ruthenium halide vapors at elevated temperatures produces a reaction product of ruthenium with molybdenum incorporated in the wire having a higher critical temperature than ruthenium. Likewise, the reaction of other non-superconductive base metals such as tungsten with superconductive metallic elements yields superconductors in situ having the improved properties described. Furthermore, certain of the crystalline reaction products of a non-superconductive base metal with a superconductive metallic element having the improved properties do not possess a $\beta$-tungsten structure. Consequently, the present invention is necessarily limited only to the preparation of a superconductor in situ by reacting a superconductive element with a non-superconductive element wherein a solid metal body is contacted with a metallic element and at least a portion of the metal body is converted to a product having the improved properties.

It is also apparent that novel superconductive structural members have been provided according to the method of the invention. It is not desired to limit the invention to the particular structural members of the examples since it will be obvious to those skilled in the art that different shapes or forms may be made by the method of the invention if so desired. Further examples illustrating particularly suitable applications for the practice of the invention can be described in conjunction with reference to "Applications of Superconductivity" by Theodore A. Buchhold, Scientific American, March 1960, pp. 2–10. An important consideration in the selection of superconductors for the cryogenic electromechanical devices disclosed therein is the linear relationship between mechanical force and the square of the electrical fields. It is apparent that superconductors possessing high critical fields are highly advantageous in such devices. In further reference to these devices, it is necessary that the physical surfaces of the superconducting parts be adequately smooth and continuous to minimize the distortion of applied magnetic fields with the possibility attendant thereto that the distorted field will exceed the critical field strength of the superconductor at the operating temperature. It should be pointed out that it would be impracticable to produce the present compound-type superconductor by conventional means because of the inherent physical properties of high hardness, brittleness, lack of ductility and notch sensitivity of most superconductive materials. In view of this discussion, it will be apparent to the man skilled in the art, therefore, that such products as improved superconductive mechanical bearings can be prepared according to the invention from a strain-free niobium bearing having polished surfaces which require a minimum of additional polishing after treatment to meet required dimensional tolerances.

It is contemplated by the appended claims to cover any such modifications as fall within the true spirit and scope of this invention.

What we claim as new and desire to secure by Letters Patent of the United States is:

1. An improved superconductor which comprises a niobium wire having a surface layer of the crystalline reaction product of niobium with tin, said superconductor having superconductivity characteristics improved as compared to those of niobium.

2. An improved superconductor which comprises a base layer of niobium and a surface layer approximately 0.001 inch in thickness and comprising substantially $Nb_3Sn$, said superconductor having superconductivity characteristics improved as compared to those of niobium.

3. An improved superconductor which comprises a base metal body having superconductivity characteristics, and an adherent surface layer of a crystalline reaction product of niobium with tin on said body, said surface layer having superconductivity characteristics superior to those of said base metal body.

4. A method for the preparation of an improved superconductor which comprises the steps of contacting niobium with a second metal selected from the group consisting of tin, gallium and aluminum on a base metal body having superconductivity characteristics, said contacting step being carried out in an atmosphere substantially nonreactive with the niobium and said second metal and at an elevated temperature at least as high as the melting point temperature of the said second metal, and maintaining the said atmosphere and elevated temperature conditions until the niobium and said second metal react to form in situ a crystalline reaction product having superconductivity characteristics.

(References on following page)

References Cited by the Examiner

UNITED STATES PATENTS

| | | | |
|---|---|---|---|
| 1,562,202 | 11/25 | Boving | 29—194 |
| 2,704,431 | 3/55 | Steele | 333—99 |
| 2,800,772 | 7/57 | Carroll | 307—88.5 |
| 2,812,270 | 11/57 | Alexander | 117—30 |
| 2,866,842 | 12/58 | Matthias | 317—158 |
| 2,866,842 | 12/58 | Matthias | 333—99 |
| 2,983,889 | 5/61 | Green | 307—88.5 |
| 2,991,197 | 7/61 | Sandoz | 29—194 |
| 3,015,041 | 12/61 | Young | 307—88.5 |
| 3,044,156 | 7/62 | Whitfield | 29—197 X |
| 3,078,554 | 2/63 | Carlson | 29—197 X |
| 3,091,556 | 5/63 | Behrndt | 117—227 |

OTHER REFERENCES

"Superconductivity," General Electric Review, published June 1946, pages 19 to 24, by Dr. C. W. Hewlett.

Applications of Superconductivity by Theodore Buchhold, "Scientific American," March 1960, pages 2–10.

Scientific American, volume 197, No. 5, page 100, November 1957.

Physical Review, volume 95, page 1435, September 1954.

"The Cryotron—A Superconductive Computer Component," by D. A. Buck, March 1957; published Instruments and Automation, pages 476–478.

DAVID L. RECK, *Primary Examiner.*

HYLAND BIZOT, *Examiner.*